(12) United States Patent
Fong et al.

(10) Patent No.: US 7,633,342 B2
(45) Date of Patent: Dec. 15, 2009

(54) RF VARIABLE GAIN AMPLIFIER

(75) Inventors: Neric Fong, Fremont, CA (US); Chinchi Chang, Fremont, CA (US); Didmin Shin, Milpitas, CA (US)

(73) Assignee: VIA Technologies Inc., Taipei (TW)

( * ) Notice: Subject to any disclaimer, the term of this patent is extended or adjusted under 35 U.S.C. 154(b) by 0 days.

(21) Appl. No.: 12/212,443

(22) Filed: Sep. 17, 2008

(65) Prior Publication Data

US 2009/0009252 A1    Jan. 8, 2009

Related U.S. Application Data

(62) Division of application No. 11/494,849, filed on Jul. 28, 2006, now Pat. No. 7,443,241.

(60) Provisional application No. 60/740,028, filed on Nov. 28, 2005.

(51) Int. Cl.
 *H03F 3/45* (2006.01)
(52) U.S. Cl. .................................... 330/254; 330/257
(58) Field of Classification Search ................. 330/254, 330/257, 288
See application file for complete search history.

(56) References Cited

U.S. PATENT DOCUMENTS 7,057,457 B2 * 6/2006 Irvine et al. ................ 330/252
7,109,796 B2 * 9/2006 Heigelmayer et al. ....... 330/254

* cited by examiner

*Primary Examiner*—Robert Pascal
*Assistant Examiner*—Hieu P Nguyen
(74) *Attorney, Agent, or Firm*—Wang Law Firm, Inc.; Li K. Wang

(57) ABSTRACT

A RF variable gain amplifier with an extended linear tuning range is disclosed. The variable gain amplifier employs a wide swing cascode mirror formed by two cascode transistors and two gain transistors. The two cascode transistors track each others so are the two gain transistor. The gain transistors operate on the saturation region.

6 Claims, 14 Drawing Sheets

RF VARIABLE GAIN AMPLIFIER

CROSS REFERENCE TO RELATED APPLICATION

This application is a divisional application of U.S. patent application Ser. No. 11/494,849, filed on Jul. 28, 2006, which claims the benefit of U.S. Provisional Application No. 60/740,028, CMOS RF VARIABLE GAIN AMPLIFIER, filed on Nov. 28, 2005, and now issued as U.S. Pat. No. 7,443,241 B2 on Oct. 28, 2008, the entirety of which is hereby incorporated herein by this reference.

BACKGROUND OF THE INVENTION

1. Field of Invention

The invention relates to an amplifier, and particularly to a variable gain amplifier.

2. Related Art

One of the major challenges of the Wideband Code Division Multiple Access (WCDMA) systems is a need for an accurate linear-to-dB gain control over 74-dB of gain tuning range. For a WCDMA transmitter (TX), the two system architectures as shown in FIG. 1 are commonly used: direct-conversion 100, and 2-stage conversion 150. Compared to the 2-stage conversion 150, the direct conversion 100 provides a better solution from both image (sideband) rejection and power saving perspectives. The output of a mixer includes a desired signal and an undesired sideband. However, the gain control requirements for the high accuracy and the wide tuning range hinder the popularity of the direct conversion. Consider the direct conversion architecture 100 FIG. 1a that is used to provide a gain control range of 90-dB. The IQ baseband inputs are received by baseband variable gain low pass filters 102, modulated by radio frequency (RF) signals at RF modulation mixes 104, 106, and finally pass through a RF variable gain amplifier (RF VGA) 108. The gain control is usually shared between the IQ baseband low pass filters (LPF) 102 and the RF VGA 108. For RF VGA 108, the maximum gain control range is approximately 30-dB due to limited device isolation at RF VGA 108. Therefore, at least 60-dB gain control has to be assigned to the LPFs 102. This sets a very strict local oscillator (LO) leakage requirement to the IQ mixers 106, which must have at least 80-dB of LO rejection in order to achieve −20 dBc carrier level at minimum gain setting. Carrier leakage calibration techniques can be use, but most of the techniques require a very accurate and sensitive RF detector and complex digital signal processor (DSP), making the direct conversion a less attractive solution.

To alleviate the high gain control in the IQ LPF, an architecture using a intermediate frequency (IF) VGA as shown in FIG. 1b can be added to provide extra gain control and more accurate gain tuning. Furthermore, this architecture also resolves the LO leakage problem by external filtering. In FIG. 1b, the IQ baseband inputs are received by baseband variable gain low pass filters 154, modulated by intermediate frequency (IF) signals at IF modulation mixes 156, 158 and finally pass through an IF variable gain amplifier (IF VGA) 160. After the IF VGA 160, a second stage conversion begins with a RF up-conversion mixer 162 where the signal from the first stage is mixed with the RF, and then the result passes through a RF VGA 162. Consider the nodes before and after the RF mixer 162 (node X and Y respectively) and the corresponding signals at these two nodes are shown in FIG. 2, where the carrier is represented by an arrow 202 and the signal is represented by a triangle 204. After the IF VGA at X, both the signal 204 and the carrier 202 scale according to the VGA gain, and the IF LO rejection remains the same as the attenuation occurs after the IF mixing stage. The LO rejection is the difference between the signal and the carrier leakage and the VGA after the RF mixer 162 attenuates both the signal and the carrier leakage by the same amount, so LO rejection remains the same. For example, for VGA gain=−10 dB, signal=10 dBm, carrier=−10 dBm:

| | |
|---|---|
| without the VGA | LO rejection = 10 dBm − (−10 dBm, carrier) = 20 dB |
| If the VGA is placed before the mixer | LO rejection = 10 dBm − 10 dB (due to VGA) − (−10 dBm, carrier power) = −10 dBm |
| if the VGA is placed after the mixer | LO rejection = 10 dBm − 10 dB (due to VGA) − [(−10 dBm, carrier) − 10 dB (due to VGA)] = 20 dB |

The result is the same as in the first case because both signal and carrier are attenuated by the VGA.

A RF mixer 162 will introduce a RF LO tone, which is one IF away from the signal, since if the frequency at the mixer is IF and the output will be LO+IF and LO−IF. By choosing a wide enough IF (e.g. 400-MHz), the RF LO tone can be removed by an external SAW filter before the power amplifier. In theory, all the gain control can be assigned to the IF VGA, but this will require the RE driver to have a very low noise performance. As a consequence, variable gain assignment will still be assigned across all three stages (LPF, IF VGA and RF VGA) in practical implementation, which makes tuning difficult.

Another two commonly used variable gain topologies are: (a) translinear cell (FIG. 3) and (b) current steering circuit (FIG. 4). However, both topologies have relatively poor performance in terms of isolation at high frequency. Isolation is an important consideration because the total VGA tuning range is 90-dB, and therefore at least 90-dB of isolation is required across the TX chain. Typical device reverse isolation is approximately 30-dB for high frequency devices (RF devices), making circuits as shown in FIG. 3 and FIG. 4 less attractive for RE applications due to limited isolation.

Therefore, it is to a RF VGA that enables an accurate linear gain tuning range without increasing the isolation problem the present invention is primarily directed.

SUMMARY OF THE INVENTION

Briefly described, the invention is a CMOS RE variable gain amplifier with an extended linear tuning range. The variable gain amplifier employs a wide swing cascode mirror formed by two cascode transistors and two gain transistors, and the gain transistors operate on the saturation region. The two cascode transistors track each other, so are the two gain transistor.

In one embodiment, there is provided an amplifier circuit with a linear adjustable gain. The amplifier includes a first gain transistor, a second gain transistor, a current mirror circuit, a first cascode transistor, and a second cascode transistor. The first gain transistor includes a gate end, a first end, and a second end. The second gain transistor includes a gate end, a first end, and a second end. The current mirror circuit is capable of receiving a control current as an input and outputting a first reference current to the first gain transistor for controlling voltage difference between the gate end and the first end of the first gain transistor. The current mirror circuit further is capable of outputting a second reference current to the second gain transistor for controlling voltage difference between the gate end and the first end of the second gain transistor. The first cascode transistor includes a first end and a second end. The first cascode transistor is capable of generating a first output current at the second end, the first cascode transistor is connected at the first end to the second end of the first gain transistor. The second cascode transistor includes a first end and a second end. The second cascode transistor is capable of generating a second output current at the second end, and the second cascode transistor is connected at the first end to the second end of the second gain transistor. The first output current and the second output current are in function of the control current according to the linear adjustable gain.

Other objects, features, and advantages of the present invention will become apparent after review of the Brief Description of the Drawings, Detailed Description of the Invention, and the Claims.

DETAIL DESCRIPTION OF THE INVENTION

This invention introduces a RF Complementary Metal-Oxide-Semiconductor (CMOS) VGA that is capable of providing an accurate linear gain control range over temperature variation at 2 GHz. A RF VGA generally consists of three major circuit components: a core VGA that operates at 2-GHz and provides over 65-dB of gain tuning range (allowing 15-dB process margin), a linear current control that provides control current to teach VGA cell, and a linear-in-dB voltage-to-current converter (LDB). With this HF CMOS VGA, the linear-in-dB function can be implemented easily using vertical bipolar transistor for WCDMA applications, and the direct conversion architecture can be used because the RF VGA is placed after the mixing stage.

Figure 5:
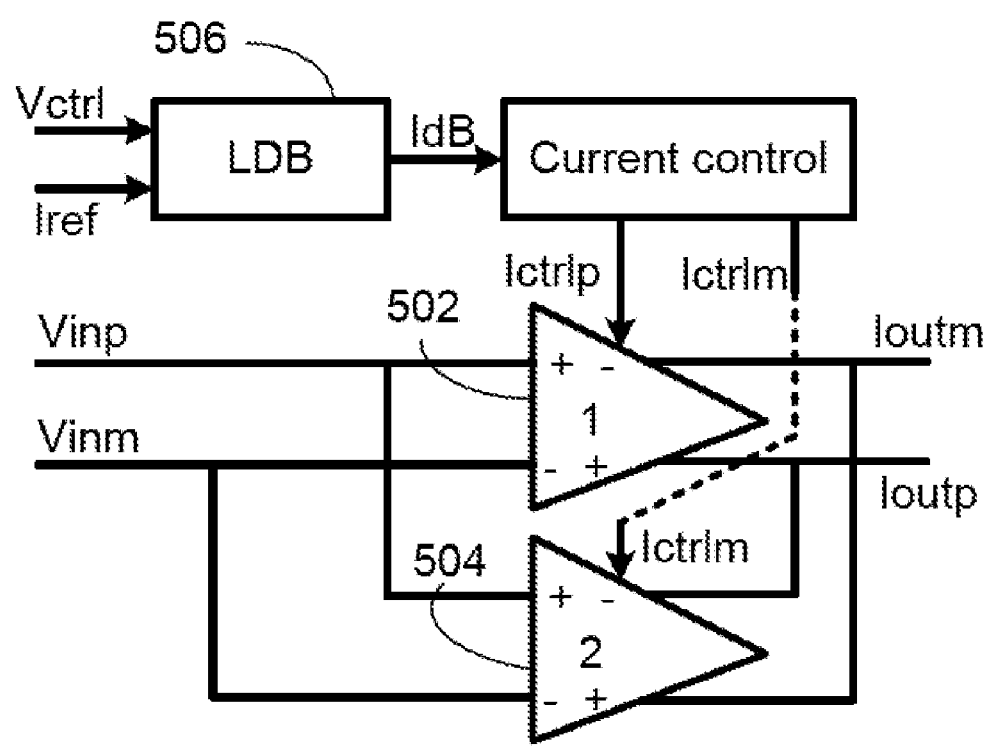
FIG. 5 illustrates a block diagram for a RF variable gain controller.

A top level block diagram of a HF VGA is shown in FIG. 5, where a control voltage and a reference current are received by a linear voltage-to-current (LDB) converter 506 and a decibel current is output by the LDB converter 506. The control voltage is transformed through a liner function into the decibel current. The decibel current is fed into a current control circuit and from which two control currents are generated. The decibel current is converted and split into the two control currents as explained below; the decibel current is a function of the reference current and the control voltage. These two control currents are fed separately to two amplifier circuits 502, 504. Each of the amplifier circuit take two voltage inputs and the control current and outputs two output currents. Each of amplifier circuit is further expanded in FIGS. 8 and 10. By connecting the two identical amplifiers 502, 504 in parallel, the RF VGA does not rely on device reverse isolation to provide the required isolation. Any feed-forward signal will be cancelled by the negative differential counterpart at the output, making it feasible for RF implementation. Using this topology, the output of the RF VGA is given by $$i_{out} = (g_{m1} - g_{m2})V_{in} \quad (1)$$

where $g_{m1}$ and $g_{m2}$ are the transconductance of the two amplifiers 502 and 504 respectively. $g_m$ is a function of current.

Figure 1:
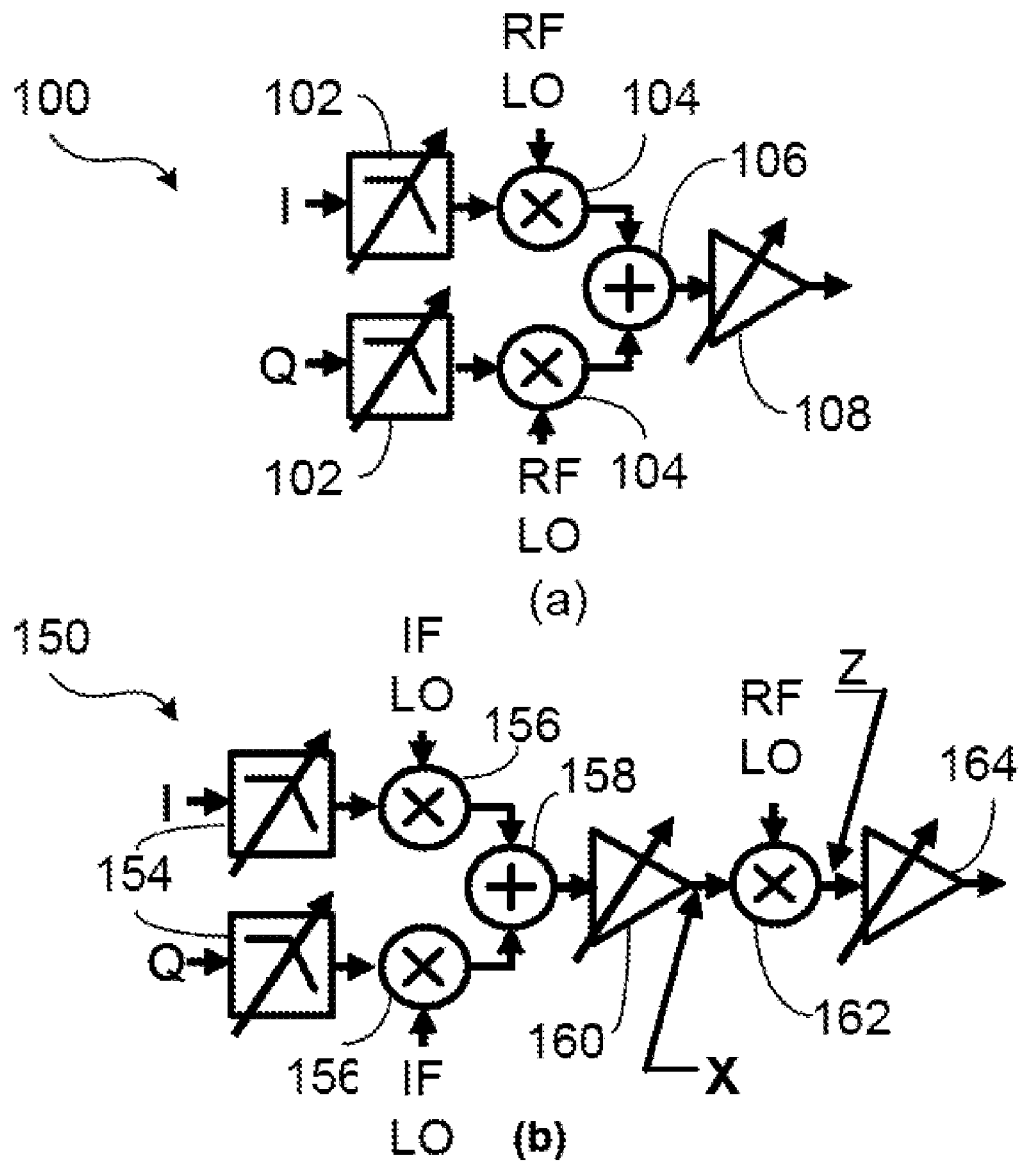
FIGS. 1a and 1b illustrate architectures for a one-stage WCDMA transmitter and a two-stage WCDMA transmitter respectively.
Figure 2:
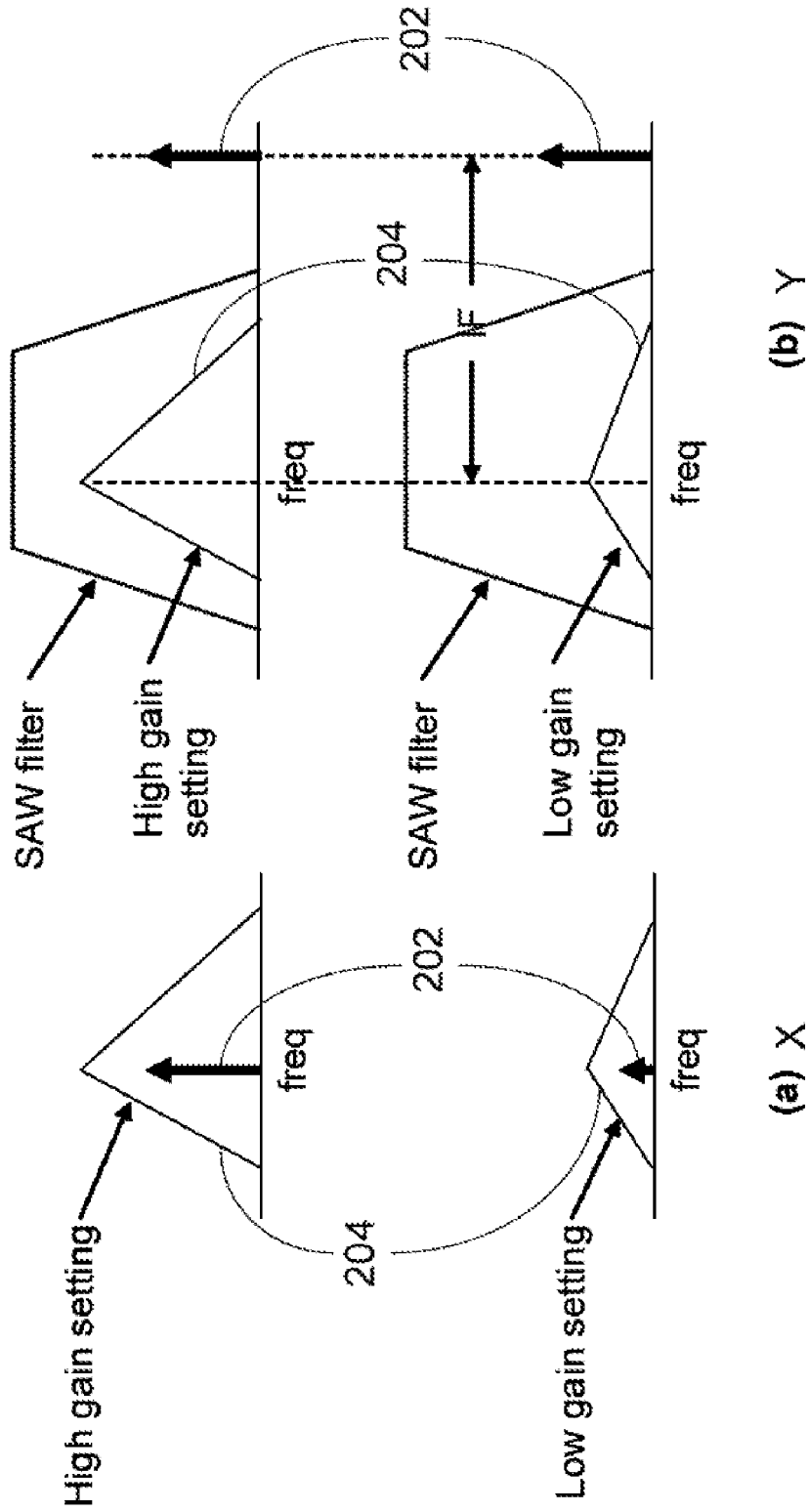
FIGS. 2a and 2b illustrate signals at different nodes of a two-stage WCDMA transmitter.
Figure 3:
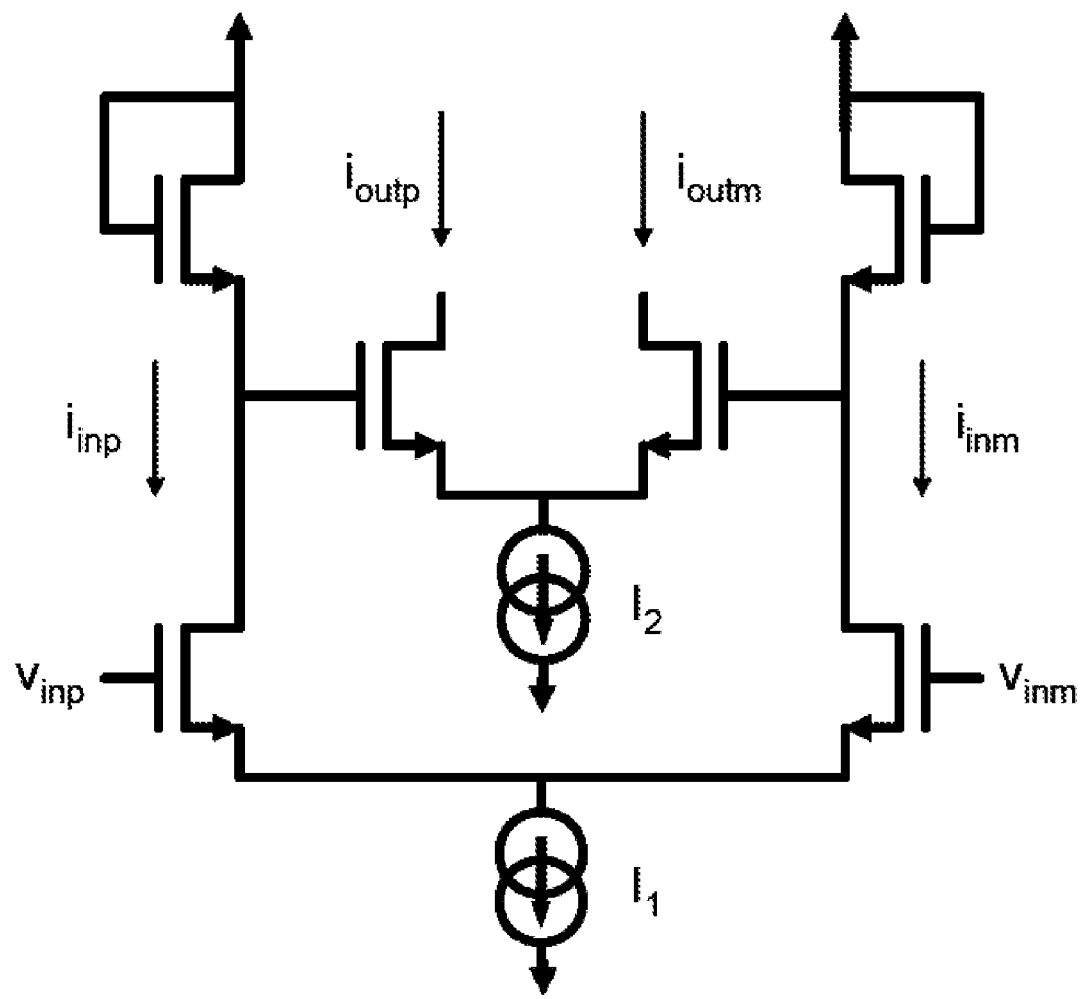
FIG. 3 illustrates a variable gain transistor in a translinear formation.
Figure 4:
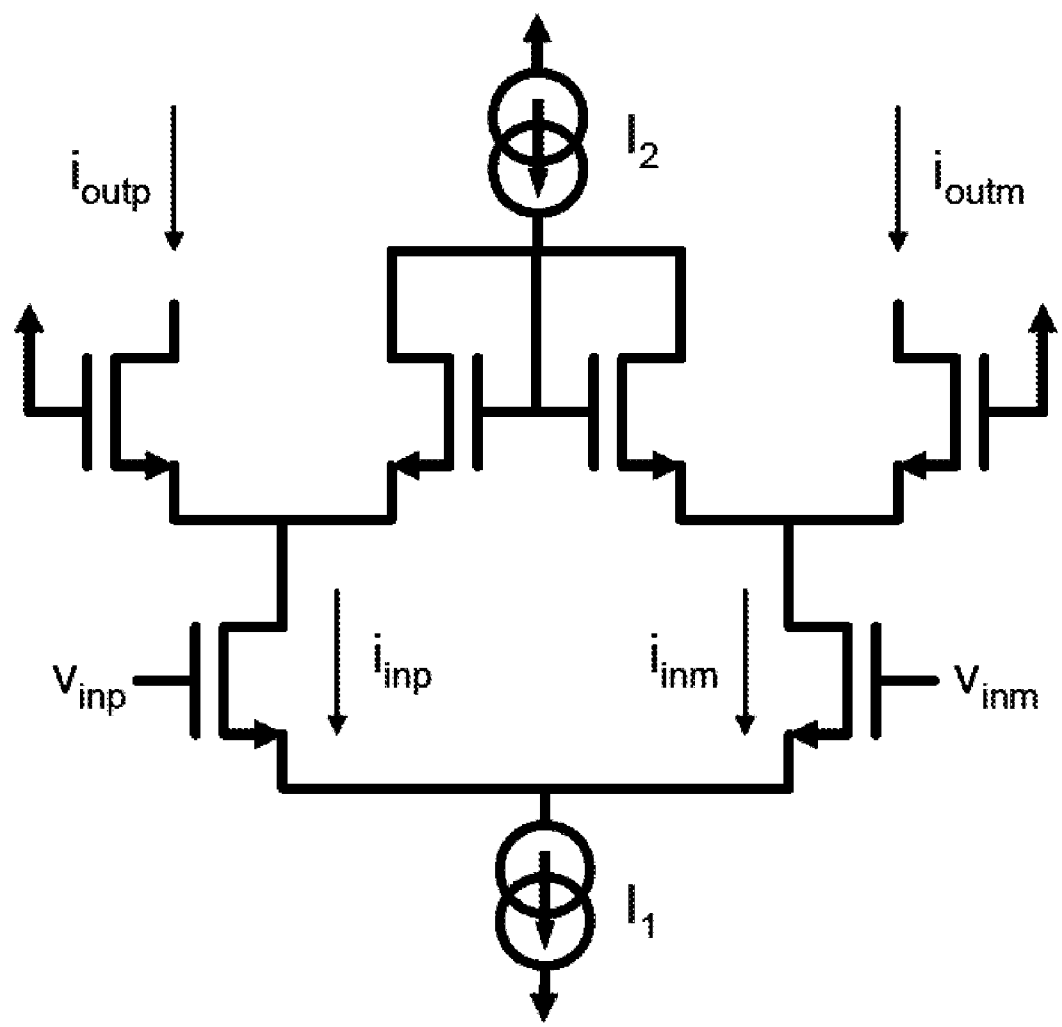
FIG. 4 illustrates a variable gain transistor in a current steering formation.

The topology of FIG. 5 has a significant advantage over others such as translinear cell shown in FIG. 3 and current steering circuit shown in FIG. 4 in terms of isolation. The proposed RF VGA, however, does not rely on device reverse isolation to provide the required isolation. Any feed-forward signal will mostly be cancelled by the negative differential counterpart at the output. This is not true because (a) the input signals are not perfectly differential, and (b) device reverse isolation is bias dependent, so the differential leakage signal cannot be cancelled out completely when summed together. Nevertheless, this topology provides superior isolation performance over the other two topologies shown in FIGS. 3 and 4.

From equation (1), the RF VGA relies on the difference in $g_m$ between the two amplifiers to perform the gain control. However, unlike bipolar transistor, $g_m$ in MOSFET is governed by the square law [3]:

$$g_m = \sqrt{2K_p I_{ctrl}} \quad (2)$$

where $k_p$ is a constant given by $$k_p = \mu_n C_{ox} \frac{W}{L} \quad (3)$$

where $\mu_n$ is the mobility, $C_{ox}$ is the gate oxide capacitance per area, and W/L is the width over length ratio of the MOSFET. The control currents $I_{ctrlp}$ and $I_{ctrlm}$ are given by $$I_{ctrlp} - I_{ctrlm} = I_{dB} \quad (4)$$

The maximum and minimum gain occurs at:

$$I_{ctrlp} = I_{dB}; I_{ctrlm} = 0 \quad \text{(max. gain)}$$

$$I_{ctrlp} = I_{ctrlm} = 0.5 I_{dB} \quad \text{(min. gain)}$$

Figure 6:
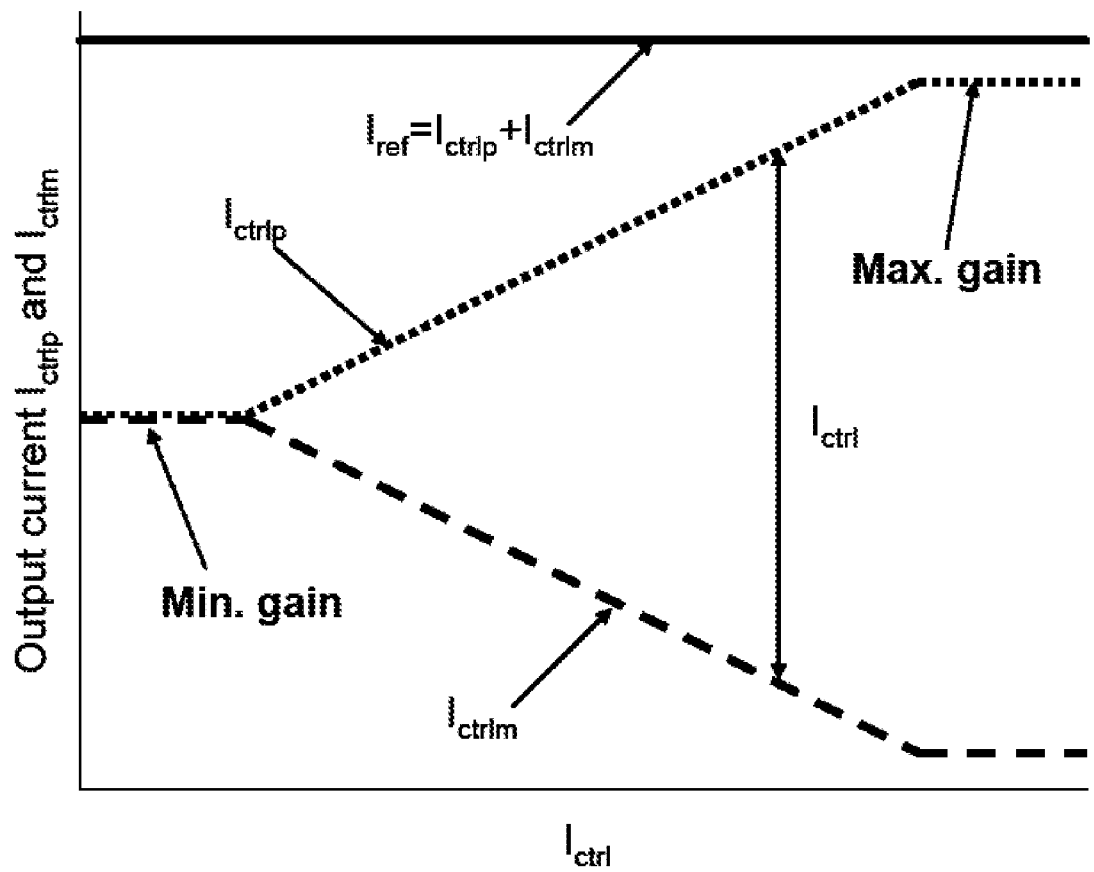
FIG. 6 illustrates a sample output showing a relationship between a gain and control currents.
Figure 7:
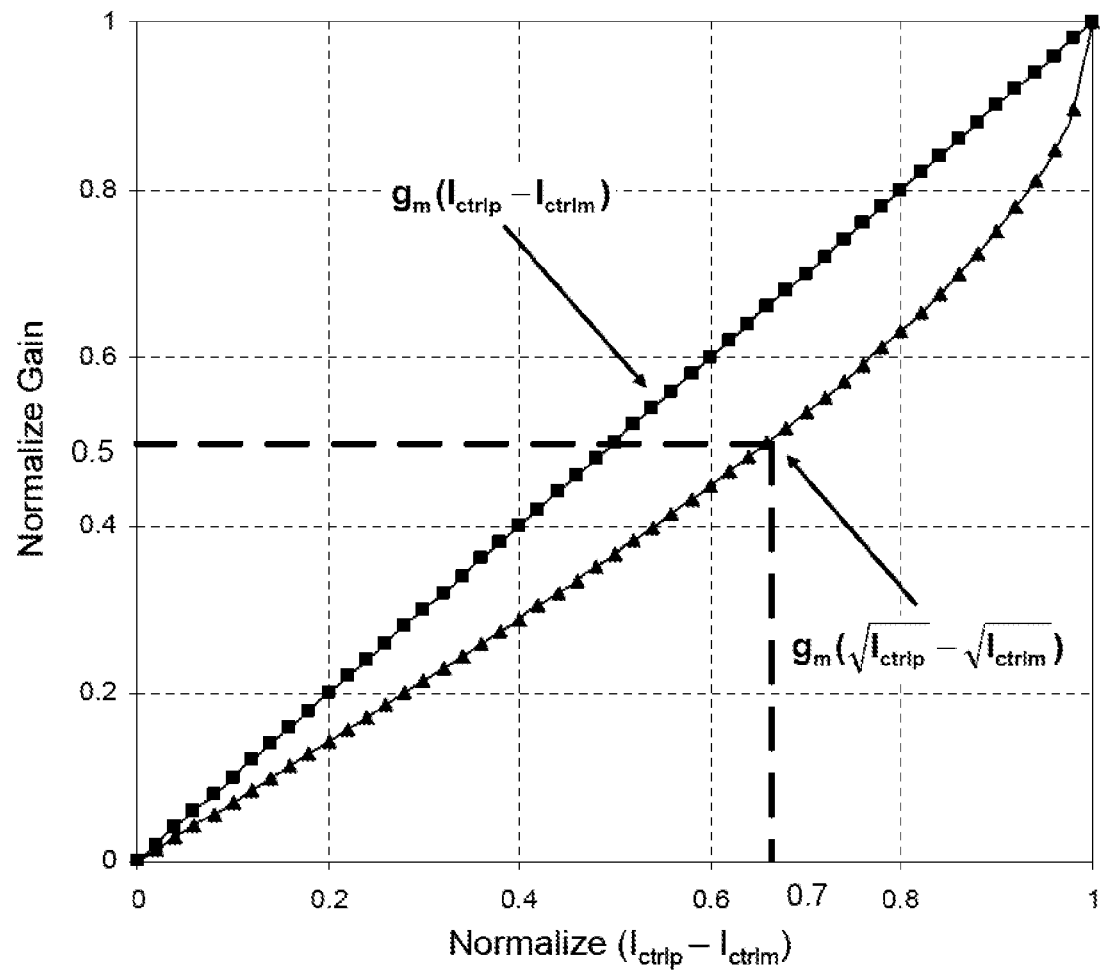
FIG. 7 illustrates a gain control comparison between an ideal gain control and a non-linear gain control.

A sample output curve showing the relationship between gain and the control currents is shown in FIG. 6. In order to have the linear gain, a linear $g_m$-I relationship is required for the gain control. If the VGA is constructed based on equation (1) and (2), unlike bipolar transistors where $g_m$ is linearly proportional to current, the square root relationship will result in gain control deviation as shown in FIG. 7. As can be seen in FIG. 7, the usable linear control range is approximately 70% at 50% gain. The usable linear control range is reduced by 30%, and half of the gain is wasted. This is a less than desired situation in mobile RF circuits because wasting gain at RF results in unacceptable high power dissipation.

Figure 8:
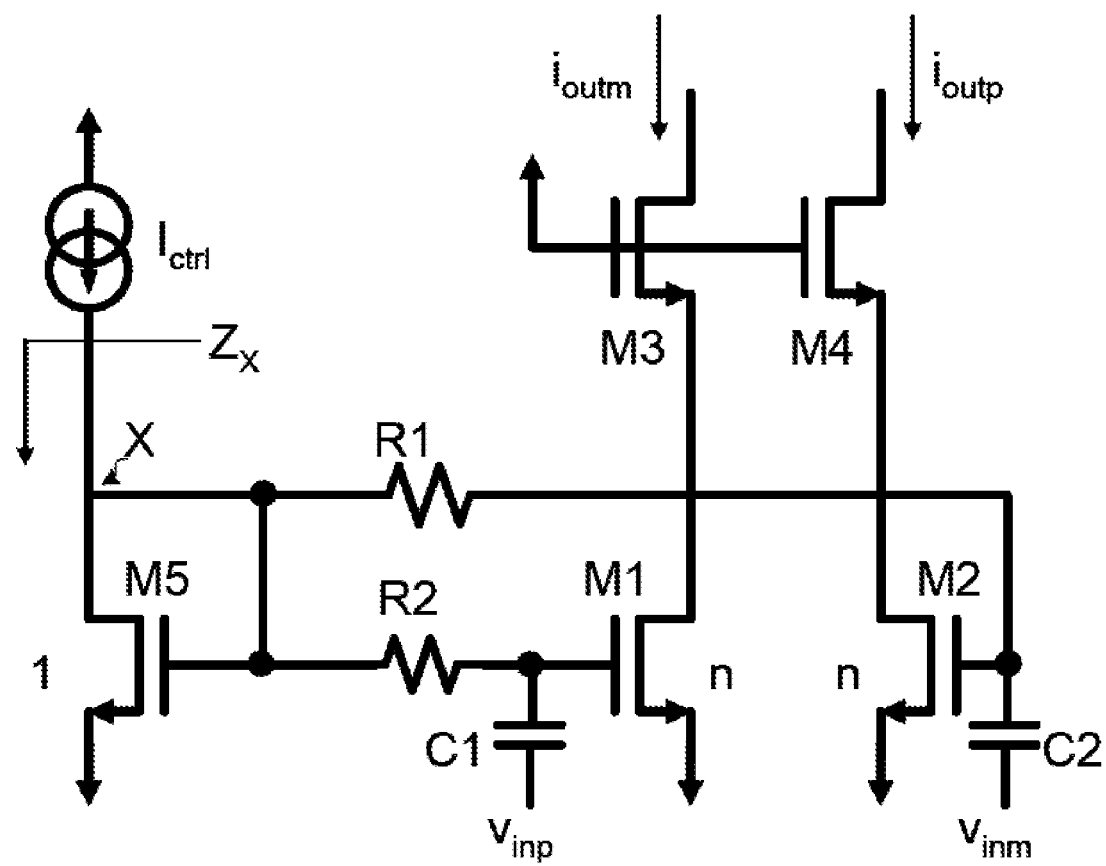
FIG. 8 illustrates a RF VGA according to one embodiment of the invention.

The reduction in usable gain and tuning range can be resolved by using the current mirror biasing scheme. Consider the cascode amplifier as shown in FIG. 8, where M1 and M2 are the gain transistors, M3 and M4 are the cascode transistors, and M5 is the diode-connected MOSFET that mirrors the reference current to M1 and M2. M3 and M4 are in a cascode formation with respect to M1 and M2 respectively. The gates of M1 and M2 connected to the M5 through R2 and R1 respectively. M1 and M2 are also connected to V $V_{inp}$ and $V_{inm}$ through C1 and C2 respectively. The R1 and P2 are the AC blocks, and the C1 and C2 serve as the DC blocks. Consider the impedance seen into the diode-connected M5 at X from DC and AC perspective:

$$Z_x = \frac{V_{gs5}}{I_{ctrl}} = \frac{1}{g_{m5}} \quad (5)$$

wherein $V_{gs5}$ is voltage between the gate and source of transistor M5, and $I_{ctrl}$ can be expressed in terms of $V_{gs5}$, given by $$I_{ctrl} K_p (V_{gs5} - V_{th})^2 \quad (6)$$

wherein $V_{th}$ is the threshold voltage of transistor M5. The sensitivity of $V_{gs5}$ due to $I_{ctrl}$ is therefore given by $$\frac{dV_{gs5}}{dI_{ctrl}} = \frac{1}{2k_p(V_{gs5} - V_{th})} \quad (7)$$

Figure 9:
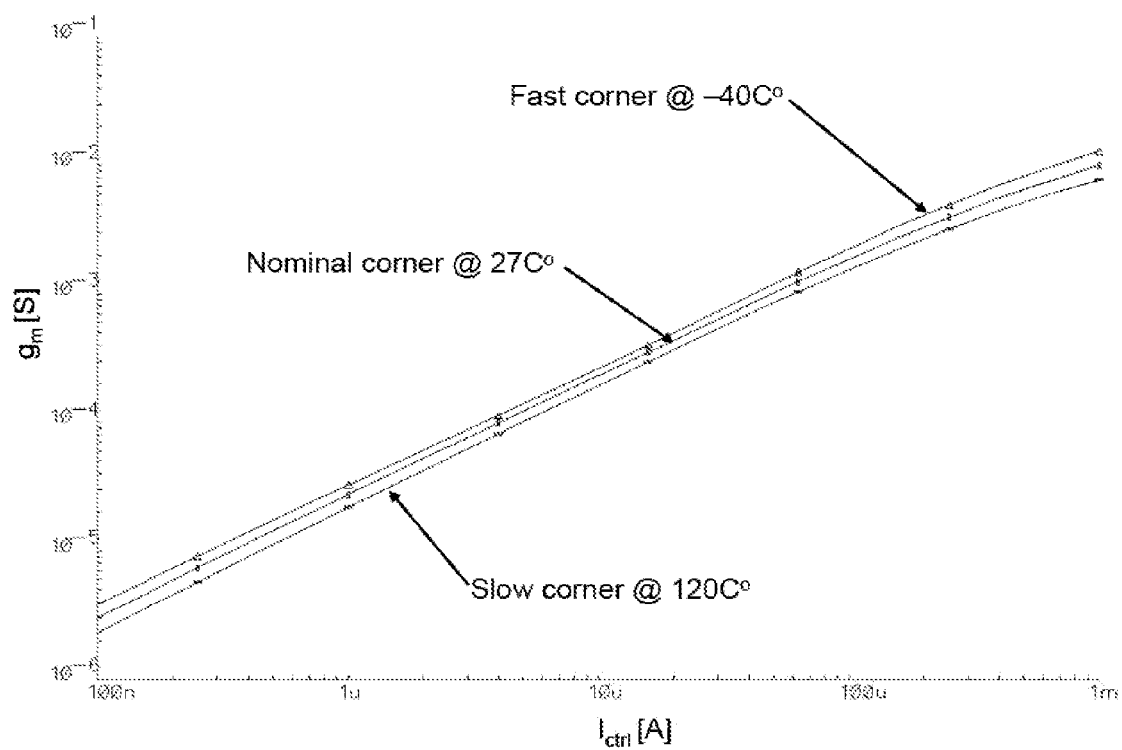
FIG. 9 is a $g_m$-I plot of a RF VGA over different temperatures and manufacturing processes.

If $k_p \to \infty$, $V_{gs5}$ can be considered as an constant. Implying this to equation (5) yields a linear $g_m$-I relationship given by $$g_{m5} = k_1 I_{ctrl} \quad (8)$$

where $k_1$ is the constant $1/V_{gs5}$. If M1, M2 and M5 are tracked then the $g_m$ of the gain transistors M1 and M2 are given by $$g_{m1} = g_{m2} = n g_{m5} = n k_1 I_{ctrl} \quad (9)$$

where n is the number of finger ratio between M1, M2 and M5. The finger ratio reflects size ratio i.e., the size of a MOSFET can be expressed as n×W/L. When two transistors track each other, if one transistor's W/L equals to five times W/L of another transistor the current of the first transistor equals to five times the current of the second transistor. To check the $k_p \to \infty$ assumption, consider a RF gain transistors formed by M1 and M2 for achieving gain at RF, large W/L ratio, minimum gate length $L_{min}$ and thin gate oxide (large $C_{ox}$) are used for these transistors. All these maximize $k_p$, making equation (8) a valid approximation. This is verified by simulation as shown in FIG. 9.

The circuit of FIG. 8 improves the linear control range. but it still has its limits. FIG. 9 is an illustration of a $g_m$-I plot of M5 over temperature and process corners.

Equation (9) assumes M1, M2 and M5 are tracked. However, tracking using $L_{min}$ devices is challenging due to channel modulation given by $$I_{ctrl} = k_p (V_{gs} - V_{th})^2 (1 + \lambda V_{ds}) \quad (10)$$

where λ is the channel modulation index, which is inversely proportional to channel length, and $V_{ds}$ is the voltage between drain and source. From equation (10), it is obvious that for short channel devices to track, not only $V_{gs}$ but also $V_{ds}$ has to be the same for accurate current mirroring.

Figure 10:
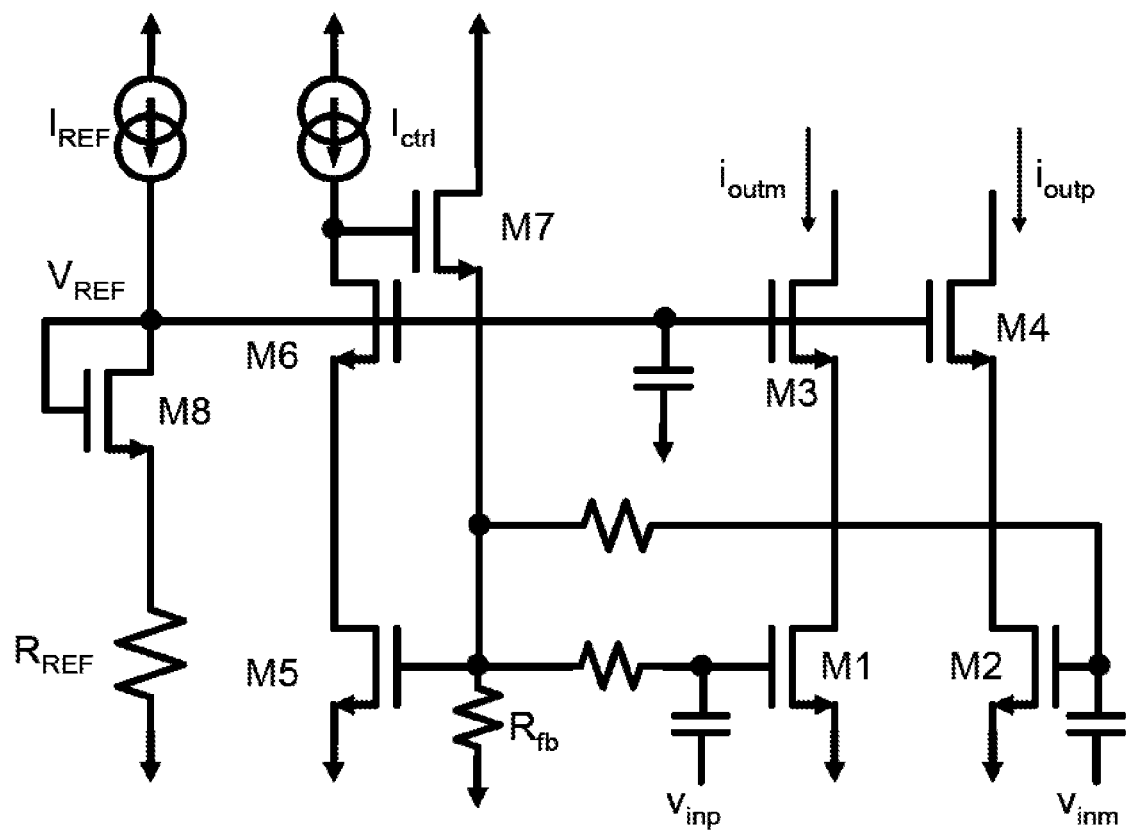
FIG. 10 illustrates a RF VGA according to an alternative embodiment of the invention.

To force M1, M2 and M5 to track each other in both $V_{gs}$ and $V_{ds}$, the amplifier can utilize the cascode transistors (M3, M4) to form a wide swing cascode mirror as shown in FIG. 10. In the circuit shown in FIG. 10, M1 and M3 remain in the same cascode arrangement, and M2 and M4 also remain in the same cascode arrangement. Another cascode transistor M6 is introduced to form a cascode arrangement with transistor M5. The gates of M3, M4, and M6 are connected together and these gates are connected to a diode-connected MOSFET M8. MG is introduced to define $V_{ds}$ of M5. {M1, M2, M5} have the same gate length and the same current density. {M3, M4, M6, M8} also have the same gate length and the same current density. Since the cascode transistors {M3, M4, M6} are scaled (tracked), the $V_{gs}$ across these transistors will be the same for given $I_{ctrl}$. This forces the $V_{ds}$ across {M1, M2, M5} to be the same as long as the MOSFETs, M3, M4, M6, and M8 are operating in the saturation region. M7 is used to force M6 to operate in saturation region, and $I_{REF} \times R_{REF}$ defines the $V_{ds}$ of {M1, M2, M5} to ensure saturation operation. Note that for low-voltage operation, M8, $I_{REF}$ and $R_{REF}$ can be removed with $V_{REF}$ pulled directly to $V_{DD}$.

In FIG. 10, two control currents, $I_{ctrlp}$ and $I_{ctrlm}$, are received and two input voltages, $V_{inp}$ and $V_{inm}$, are received. Two output currents, $I_{outm}$ and an $I_{outp}$, are output by the circuit of FIG. 10. A DC bias current is mirrored to two gain transistors, M1 and M2.

Figure 11:
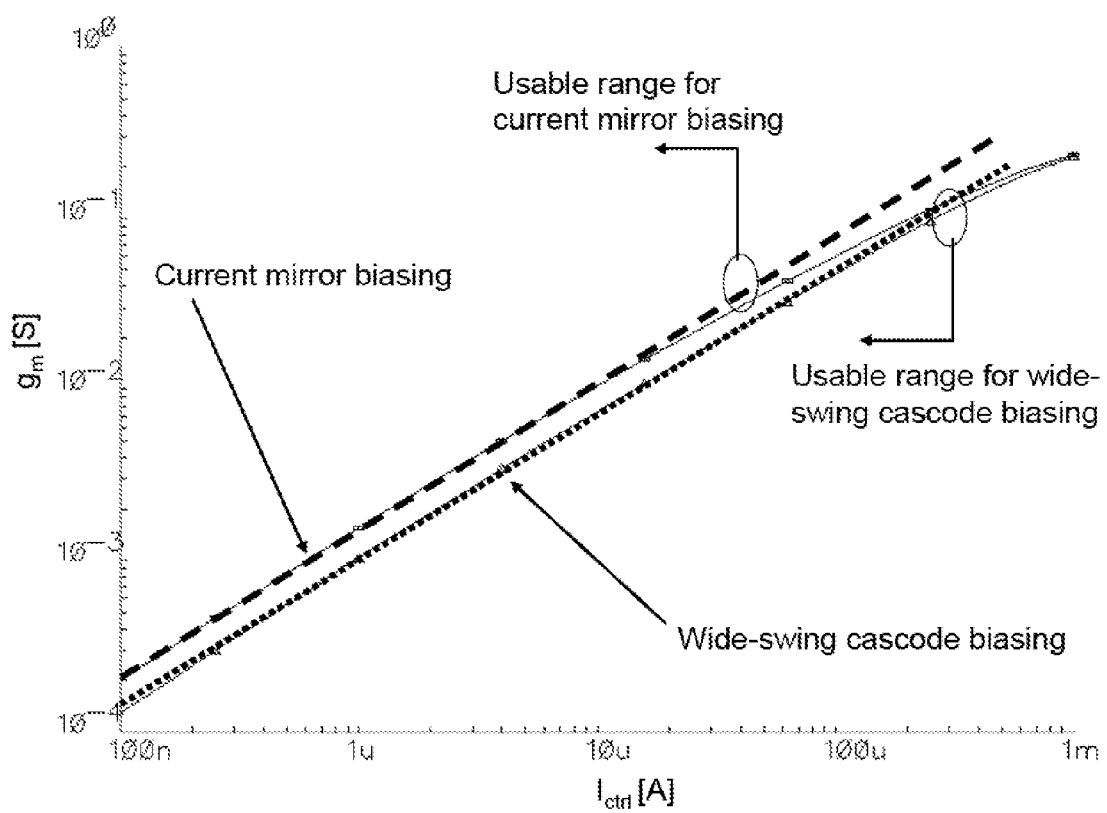
FIG. 11 illustrates a $g_m$-I plot comparison between two embodiments of the invention.

The improvement of using wide-swing cascode biasing over current mirror biasing is examined by simulation as shown FIG. 11. Cascode biasing has at least 5 times larger usable tuning range as compared to current mirror biasing. Note that at low $I_{ctrl}$ region, the performance is about the same because of small $V_{ds}$ (recall $V_{gs} = V_{ds}$ for M5).

Figure 12:
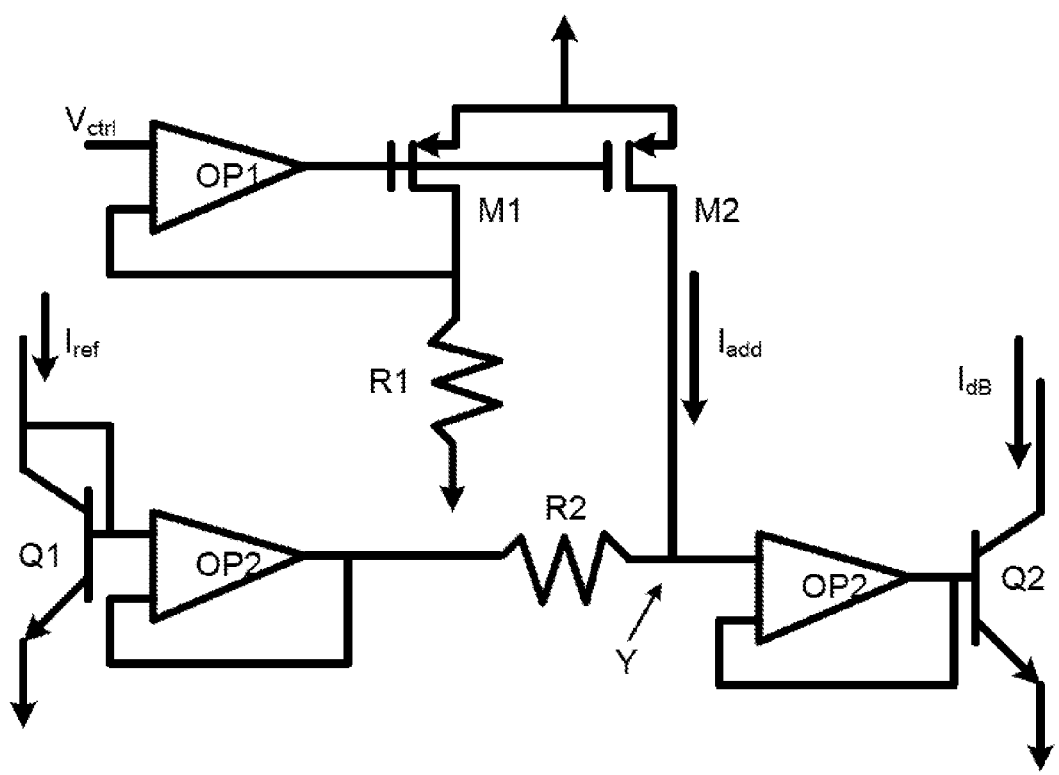
FIG. 12 illustrates a liner-in-db voltage-to-current converter.

The linear-to-dB voltage-to-current converter (LDB) shown in FIG. 5 can takes an external input control voltage $V_{ctrl}$ and output a log scaled control current $I_{dB}$ given by $$I_{db} = I_{ref} e^{K_{LDB} V_{ctrl}} \quad (11)$$

where $K_{LDB}$ is the game slope of the converter. To generate the exponential function, a vertical NPN (VNPN) bipolar transistor is used because it has the form $$I_c = I_S e^{V_{be}/V_T} \quad (12)$$

where $I_c$ is the collector current, $I_S$ is the saturation current, $V_{be}$ is the base emitter voltage, and $V_T$ is the thermal voltage given by $$V_T = \frac{kT}{q} \quad (13)$$

where k is the Boltzmann's constant, T is the temperature and q is the unit charge constant. A current mirror topology as shown in FIG. 12 is used to implement the converter. OP1, OP2, and OP3 are op-amps, Q1 and Q2 are VNPN transistors, and M1 and M2 are PMOS. The output control current is given by $$I_{dB} = I_S e^{(V_{be1} + \Delta V)/V_T} \quad (14)$$

where ΔT is the voltage drop given by $I_{add} \times R_2$ because the output of OP2 is an analog ground. By making M1 and M2 the same, $I_{add}$ is given by $V_{ctrl}/R_1$, and hence $$\Delta V = \frac{V_{ctrl} R_2}{R_1} \quad (15)$$

substituting (15) back to (14) results in $$I_{ctrl} = I_s \exp\left(\frac{V_{bel}}{V_T} + \frac{R_2}{R_1}\frac{V_{ctrl}}{V_T}\right) \quad (16)$$

$$= I_{ref} \exp\left(\frac{R_2}{R_1}\frac{V_{ctrl}}{V_T}\right)$$

This yields equation (11)

$$I_{db} = I_{ref} e^{K_{LDB} V_{ctrl}}$$

With $k_{LDB}$ given by $$k_{LDB} = \frac{R_2}{V_T R_1} \quad (17)$$

OP1 is an input follower that copies $V_{ctrl}$ to the plus terminal of R1; OP2 and OP3 are unity gain buffers to compensate the low β in VNPN transistors.

Note that $k_{LDB}$ is temperature dependent, but the automatic gain control (AGC) of the WCDMA requires a constant $k_{LDB}$ over temperature. Re-expressing the exponent term $k_{LDB} \cdot V_{ctrl}$ in (16) gives $$k_{LDB} \cdot V_{ctrl} = \frac{R_2}{R_1}\frac{V_{ctrl}}{V_T} = \frac{I_{add} R_2}{V_T} \quad (18)$$

Figure 13:
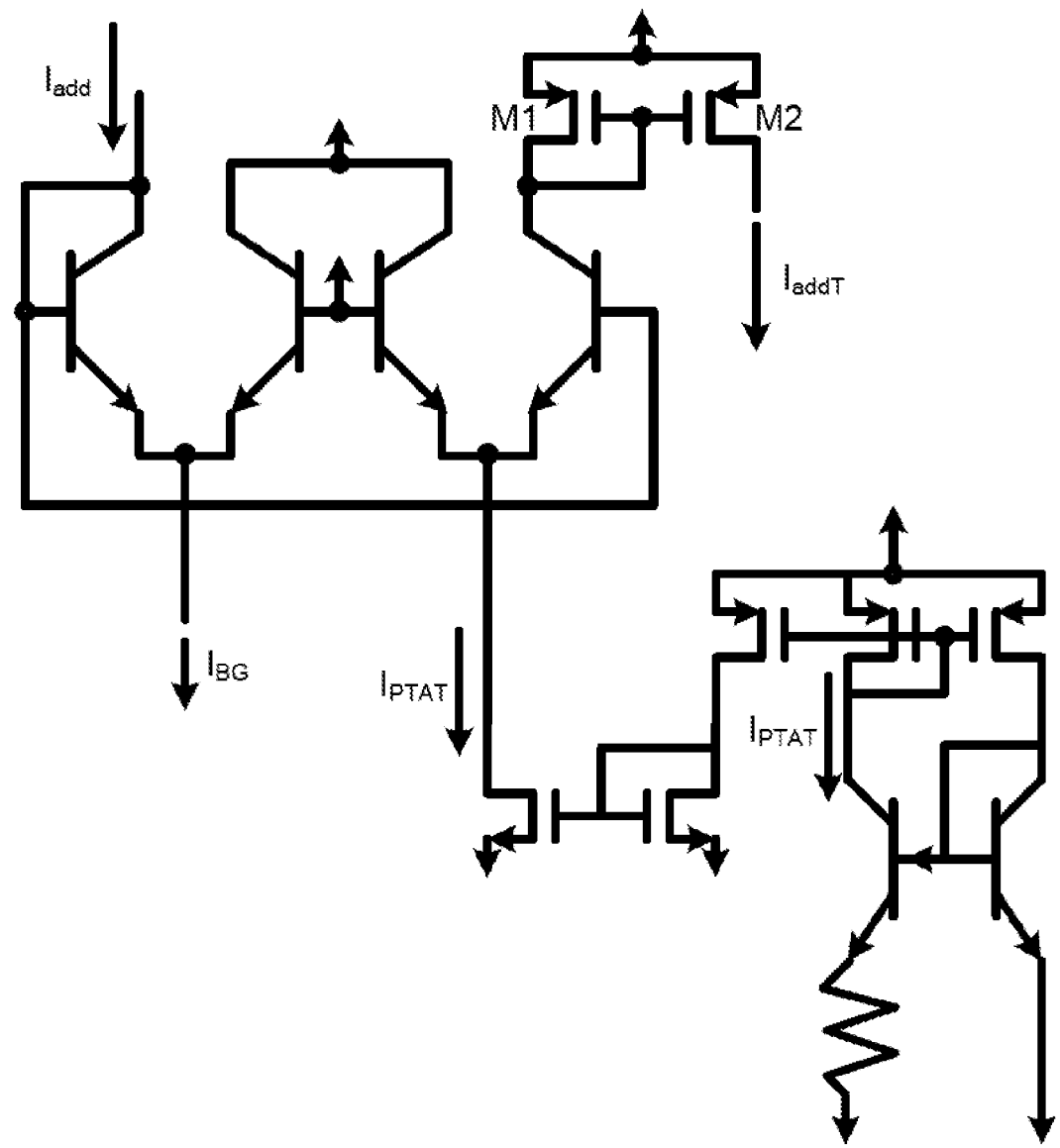
FIG. 13 illustrates a temperature compensation circuit using current multiplier and PTAT circuit.
Figure 14:
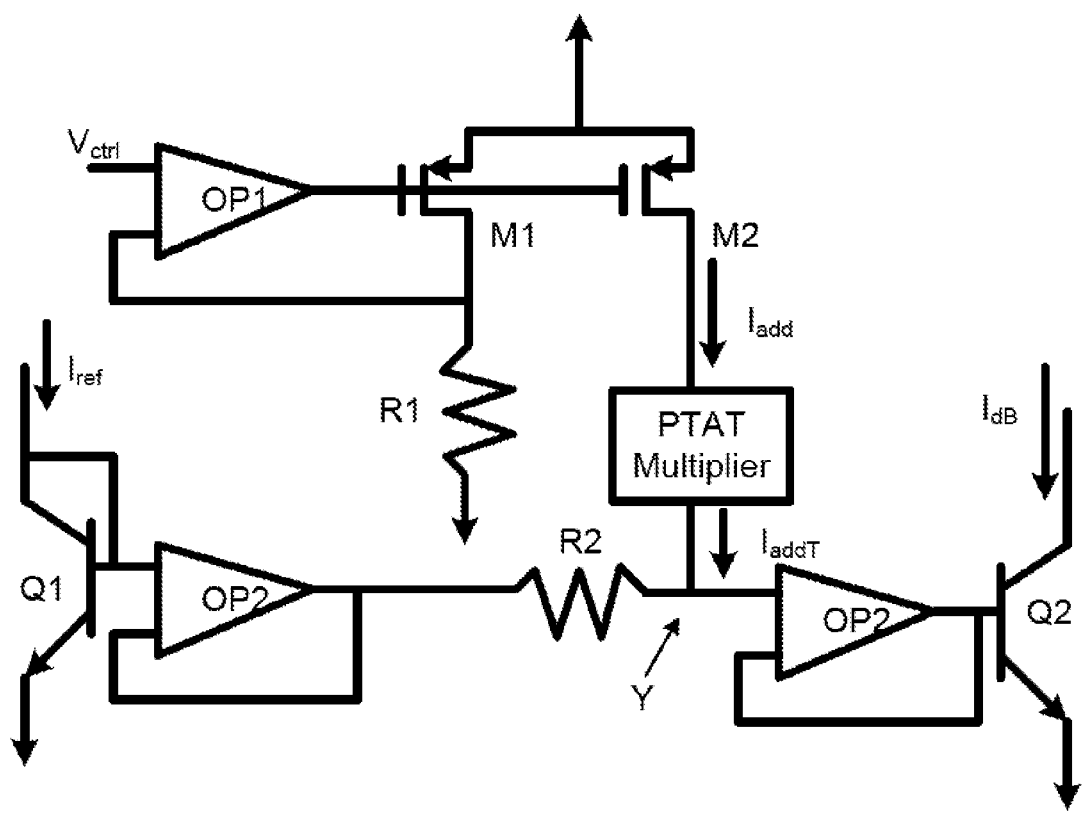
FIG. 14 illustrates a temperature compensated linear-to-db voltage-to-current converter.

Therefore, the temperature dependency can be compensated by making $I_{add}$ proportional to temperature. This can be achieved by multiplying $I_{add}$ with a proportional-to-absolute-temperature (PTAT) current as shown in circuit as shown in FIG. 13. The temperature compensated $I_{addT}$ (FIG. 13) is given by $$I_{addT} = I_{add}\frac{I_{PTAT}}{I_{BG}} \quad (19)$$

where $I_{BG}$ is the temperature independent bandgap current. $I_{PTAT}$ (FIG. 13) is given by $$I_{PTAT} = k_{PTAT} V_T \quad (20)$$

where temperature independent $k_{PTAT}$ is given by $$kPTAT = \frac{1}{R}\ln\left(\frac{J_{c2}}{J_{c1}}\right) \quad (21)$$

where $J_{c1}$ and $J_{c2}$ are the current density of Q1 and Q2 respectively. Replacing $I_{addT}$ into (18) results in $$k_{LDB} \cdot V_{ctrl} = \frac{I_{addT} R_2}{V_T} = I_{add}\frac{k_{PTAT} V_T}{I_{BG}}\frac{R_2}{V_T}$$

$$= I_{add}\frac{k_{PTAT} R_2}{I_{BG}}$$

which is temperature independent. The final temperature compensated LDB circuit is shown in FIG. 14 with $k_{LDB}$ given by $$k_{LDB} = \frac{R_2 k_{PTAT}}{R_1 I_{BG}} \quad (22)$$

The temperate compensated LDB circuit is simulated and the result shows the target $V_{ctrl}$ tuning range is from 0.4-V to 1.4-V, and the target output $I_{ctrl}$ is from 1-μA to 100-μA. The total slope variation is only 2-dB (+/−1-dB) from, 0 to 120° C., but the variation degrades to 6-dB if the circuit is operated down to 40° C. This is because β drops by more than 3 times from temperature 120° C. to −40° C. Therefore, the accuracy of the VGA will degrade at extreme low temperature.

While the invention has been particularly shown and described with reference to one embodiment thereof, it is understood by those skilled in the art that many modifications and other embodiments of the invention will come to mind to which the invention pertains, having the benefit of the teaching presented in the foregoing description and associated drawings. It is thus understood that the invention is not limited to the specific embodiments disclosed herein, and that many modifications and other embodiments of the inventions are intended to be included within the scope of the appended claims. Specifically, the invention, though described using MOSFET transistors, can be equally implemented with other types of transistors. Each transistor described in the invention can be either a N-type or P-type transistor. While the invention is motivated by problems faced during developments of a WCDMA project, it is understood by those skilled in the art that the solution presented by the invention is equally applicable for Global Switching Mobile (GSM) system. wide area local network (WLAN), and other applications where the linear-to-DB control is important. Moreover, although specific terms are employed herein, as well as in the claims, they are used in a generic and descriptive sense only, and not for the purposes of limiting the described invention, nor the claims which follow below. Although elements of the invention may be described or claimed in the singular, the plural is contemplated unless limitation to the singular is explicitly stated.

What is claimed is:

1. An amplifier circuit with a linear adjustable gain, comprising:
    a first gain transistor including a gate end, a first end, and a second end;
    a second gain transistor including a gate end, a first end, and a second end;
    a current mirror circuit being capable of receiving a control current as an input and outputting a first reference current to the first gain transistor for controlling voltage difference between the gate end and the first end of the first gain transistor, the current mirror circuit further being capable of outputting a second reference current to the second gain transistor for controlling voltage difference between the gate end and the first end of the second gain transistor;

a first cascode transistor including a first end and a second end, the first cascode transistor being capable of generating a first output current at the second end, the first cascode transistor being connected at the first end to the second end of the first gain transistor; and a second cascode transistor including a first end and a second end, the second cascode transistor being capable of generating a second output current at the second end, the second cascode transistor being connected at the first end to the second end of the second gain transistor;

wherein the first output current and the second output current being in function of the control current according to the linear adjustable gain;

wherein the current mirror circuit further comprises:

a first mirror transistor including a gate end, a first end, and a second end;

a second mirror transistor including a gate end, a first end, and a second end; and a third mirror transistor including a gate end, a first end, and a second end, wherein the gate end of the first mirror transistor being coupled to the gate end of the first gain transistor, the gate end of the second gain transistor, and the first end of the third mirror transistor.

the second end of the first mirror transistor being coupled to the first end of the second mirror transistor, and the gate end of the third mirror transistor being coupled to the second end of the second mirror transistor.

2. The amplifier circuit with a linear adjustable gain of claim 1, further comprising:

a first capacitor coupled to the gate end of the first gain transistor; and a second capacitor coupled to the gate end of the second gain transistor wherein the first capacitor being capable of receiving a first alternating current (AC) input voltage and the second capacitor being capable of receiving a second AC input voltage.

3. The amplifier circuit with a linear adjustable gain of claim 1, wherein the current mirror circuit further comprising a mirror transistor, the mirror transistor including a gate end and a first end, wherein the gate end of the mirror transistor being coupled to the gate end of the first gain transistor and the gate end of the second gain transistor, the gate end of the mirror transistor further being coupled to the first end of the mirror transistor.

4. The amplifier circuit with a linear adjustable gain of claim 3, wherein the mirror transistor operates in a saturation region.

5. The amplifier circuit with a linear adjustable gain of claim 1, further comprising:

a reference transistor including a gate end, a first end, and a second end, wherein the gate end of the reference transistor being coupled to the gate end of the second mirror transistor, the gate end of the first cascode transistor, and the gate end of the second cascode transistor, and the drain end of the reference transistor, the second end of the reference transistor being capable of receiving a reference current; and a reference resistor being coupled to the first end of the reference transistor.

6. The amplifier circuit with a linear adjustable gain of claim 1, wherein each transistor in the amplifier circuit being selected from a group comprised of:

an n-type transistor, wherein the first end of each transistor being a source end of the n-type transistor and the second end of each transistor being a drain end of the n-type transistor; and a p-type transistor, wherein the first end of each transistor being a drain end of the p-type transistor and the second end of each transistor being a source end of the p-type transistor.

* * * * *